United States Patent [19]

Aizawa

[11] Patent Number: 5,514,996
[45] Date of Patent: May 7, 1996

[54] PHOTO-COUPLER APPARATUS

[75] Inventor: Yoshiaki Aizawa, Kanagawa, Japan

[73] Assignee: Kabushiki Kaisha Toshiba, Kanagawa, Japan

[21] Appl. No.: 160,966

[22] Filed: Dec. 3, 1993

[30] Foreign Application Priority Data

Dec. 4, 1992 [JP] Japan ................... 4-325385

[51] Int. Cl.$^6$ .................................................. H01L 31/00
[52] U.S. Cl. ............................................. 327/514; 250/551
[58] Field of Search .................. 307/311; 250/551; 327/514, 515, 427, 434

[56] References Cited

U.S. PATENT DOCUMENTS

| | | | |
|---|---|---|---|
| 4,390,790 | 6/1983 | Rodriguez | 250/551 |
| 4,492,883 | 1/1985 | Janutka . | |
| 4,755,697 | 7/1988 | Kinzer | 307/311 |
| 4,801,822 | 1/1989 | Idaka et al. | 307/311 |
| 4,804,866 | 2/1989 | Akiyama . | |
| 5,013,926 | 5/1991 | Aizawa . | |
| 5,138,177 | 8/1992 | Morgan et al. | 307/311 |

FOREIGN PATENT DOCUMENTS

| | | | |
|---|---|---|---|
| 0041317 | 2/1989 | Japan | 307/311 |
| 244213 | 10/1991 | Japan | 307/311 |
| 8300746 | 3/1983 | WIPO | 250/551 |

Primary Examiner—Toan Tran
Attorney, Agent, or Firm—Finnegan, Henderson, Farabow, Garrett & Dunner

[57] ABSTRACT

A photo-coupler apparatus has a light emitting element in the primary side. The secondary side of this apparatus is comprised of a photoelectromotive diode array, a light sensitive impedance element series-connected to said array, a drive transistor, and at least one output MOSFET connected to the output terminals of this apparatus. The light sensitive impedance element comes into a large impedance state when an optical signal from the light emitting element is weak. In this case, the light sensitive impedance element generates a sufficient voltage to activate the drive transistor, in spite of the photocurrent being small. This results in an improvement of the dynamic sensitivity of this apparatus. When said optical signal is strong, the impedance element comes into a small impedance state, thus providing the MOSFET with a sufficient photo-current. This results in the shortening of switching times of the output MOSFET.

8 Claims, 7 Drawing Sheets

5,514,996

PHOTO-COUPLER APPARATUS

BACKGROUND OF THE INVENTION

1. Field of the invention

This invention generally relates to a photo-coupler apparatus, and more particularly, to a photo-coupler apparatus having at least one MOSFET as an output contact.

2. Description of the prior arts

FIG. 1 shows the circuit diagram of a prior art photo-coupler apparatus (first prior art). This prior art has been published in Japanese unexamined patent publication TOKUKAISHO 57-107633 which corresponds to U.S. Pat. No. 4,390,790, and EPS 0048146.

The photo-coupler apparatus of the first prior art has a light emitting diode 1 at the primary side. The secondary side of this device is comprised of the following: a first photoelectromotive diode array 2a photo-coupled with light emitting diode 1; a second photoelectromotive diode array 2b photo-coupled with light emitting diode 1; a resistor 3 parallel-connected with second diode array 2b; a normally-ON drive FET 5; and an output MOSFET 4. In this figure, numbers 8 and 8' show the input terminals and numbers 9 and 9' show the output terminals of this photo-coupler apparatus.

As shown in FIG. 1, the photo-coupler apparatus has two photoelectromotive diode arrays 2a and 2b. Once the second photoelectromotive diode array 2b has received a light from light emitting diode 1, it creates an electromotive force. Because of this electromotive force, drive FET 5, which is normally ON, turns off. Then, the gate-source capacitor of output MOSFET 4 is rapidly charged by the photo-current from first photoelectromotive diode array 2a.

Once the incident light from light emitting diode 1 is interrupted, the accumulated charges between the gate and source of drive FET 5 are discharged through resistor 3, thus permitting drive FET 5 to turn on. At this time, the charges accumulated between the gate and source of output MOSFET 4 are rapidly discharged via the source and drain of drive FET 5 which is now in an ON state, allowing MOSFET 4 to turn off quickly.

As described above, the photo-coupler apparatus of the first prior art should include second photoelectromotive diode array 2b so as to control drive FET 5. Due to the existence of array 2b, the chip area of this apparatus increases, thus also increasing its manufacturing cost.

In FIG. 2A, the circuit structure of a photo-coupler apparatus is shown according to the second prior art of this invention. This apparatus has been published in Japanese unexamined patent publication TOKUKAISHO 63-99616 which corresponds to U.S. Pat. No. 4,873,202.

The second prior art photo-coupler apparatus has a light emitting diode 1 at the primary side. The secondary side of this apparatus is comprised of the following: a photoelectromotive diode array 2 which is photo-coupled with light emitting diode 1; an impedance element 6 connected in series with array 2; normally-ON drive FET 5; and output MOSFET 4 connected to output terminals 9 and 9'.

In this photo-coupler apparatus, once photoelectromotive diode array 2 receives a light from light emitting diode 1, a current flows through impedance element 6. Due to this current, a voltage difference, which can activate FET 5, arises between the source and gate of FET 5. Therefore, this apparatus does not need second photoelectromotive diode array 2b shown in FIG. 1 for the activation of drive FET 5.

In this case, however, impedance element 6 limits the charging current for the capacitor of MOSFET 4 when the resistance value of element 6 is large. This fact makes the charging period for MOSFET 4 longer. Thus, the time T-on, which is the period from the signal input to the turn-on of output MOSFET 4, becomes longer.

Impedance element 6 also works as a discharge resistor for discharging the accumulated charges at the source and gate of FET 5. Therefore, if the resistance value of impedance element 6 is large, the discharging period of FET 5 becomes longer. As a result, time T-off, which is the period from the cut off of an input signal to the turn-off of output MOSFET 4, becomes longer.

On the contrary, if the resistance value of impedance element 6 is small, the current flowing through impedance element 6 must be increased to obtain a sufficient voltage for the activation of drive FET S. Therefore, the magnitude of minimum input current I-ft, which is required to turn on MOSFET 4, becomes larger, thus deteriorating the dynamic sensitivity of this device. As is evident from the above mentioned explanation, there is a trade-off between the switching times (T-on and T-off) and the minimum input current I-ft of MOSFET 4. This trade-off prevents the complete improvement of the characteristics of this photo-coupler apparatus.

FIG. 2B shows the characteristic curves of the second prior art photo-coupler apparatus. The detail of this figure will be explained later in conjunction with one embodiment of this invention.

In FIG. 3A, the circuit structure of a photo-coupler apparatus is shown according to the third prior art of this invention. This apparatus has been published in Japanese unexamined parent publication TOKUKAISHO 63-153916 which corresponds to U.S. Pat. No. 4,801,822.

This apparatus has a light emitting diode 1 at the primary side. The secondary side of this apparatus is comprised of the following: a photoelectromotive diode array 2 which is photo-coupled with light emitting diode 1; impedance element 6' including a resistor 6a and a zener diode 6b connected in parallel with each other; normally-ON drive FET 5; and output MOSFET 4 connected to output terminals 9 and 9'.

In this photo-coupler apparatus of the third prior art, impedance element 6' is comprised of the parallel circuit of resistor 6a and zener diode 6b as mentioned above. Because zener diode 6b works as a bypass for resistor 6a, most of the photo-current from array 2 flows through zener diode 6b, not through resistor 6a, when the current amount is large. As a result, resistor 6b does not limit the amount of charging current for MOSFET 4. This fact permits resistor 6b to have a greater value of resistance without making T-on longer. Time T-on and minimum input current I-ft can, therefore, be improved simultaneously in the third prior art.

In said case, however, there are still some problems. That is, an extra component, zener diode 6b, is necessary to construct the photo-coupler apparatus. And, if resistor 6b has a large value of resistance so as to reduce the amount of input current I-ft (that is, to improve the dynamic sensitivity), time T-off becomes longer.

FIG. 3B shows the characteristic curves of the third prior art photo-coupler apparatus. The detail of this figure will be explained later in conjunction with another embodiment of the present invention.

To summarize the above mentioned results, the photo-coupler apparatus of the prior arts have the following disadvantages:

(1) the photo-coupler apparatus having two photoelectromotive diode arrays (in the first prior art) requires an additional chip area for the installation of the second photoelectromotive diode array in order to activate a drive FET, thus increasing the chip area as well as the manufacturing cost;

(2) although it does not require the second photoelectromotive diode array, the second prior art photo-coupler apparatus, in which an impedance element is series-connected with a photoelectromotive diode array, presents a trade-off relation between the switching times (T-on and T-off) and the minimum current I-ft (that is, sensitivity), thus preventing the improvement of the entire characteristics of this apparatus;

(3) the third prior art photo-coupler apparatus, in which an impedance element is comprised of a resistor and a zener diode parallel-connected each other, can improve both T-on and I-ft simultaneously, but it requires an extra component, zener diode 6b, and time T-off becomes longer if a large value of resistor is used to improve I-ft.

SUMMARY OF THE INVENTION

This invention has been made to overcome the above mentioned disadvantages of the prior art photo-coupler apparatus.

Therefore, the objective of the present invention is to provide a photo-coupler apparatus having at least one output MOSFET as an output contact, the apparatus which is capable of shortening the switching times of output contacts and improving its dynamic sensitivity simultaneously.

In order to implement the above mentioned objective, the secondary side of the photo-coupler apparatus of this invention is comprised of a photoelectromotive diode array 2, a light sensitive impedance element 10, at least one output MOSFET 4 connected to output terminals 9 and 9', and a normally-ON drive transistor 5, as shown in FIGS. 4, 7, and 10. Impedance element 10 is connected in series with photoelectromotive diode array 2 and changes its impedance value according to the intensity change of an input light. In actuality, impedance element 10 has a small impedance value when the light intensity from a light emitting element is strong, and a large impedance value when the light intensity is weak.

According to the above mentioned structure, normally-ON drive transistor 5, which is used to shorten the switching times of output MOSFET 4, is driven by the voltage difference across element 10. When the light intensity is strong and so the charging current for the gate-source capacitor of MOSFET 4 is large in amount, impedance element 10 comes into a small impedance state, thus not limiting the charging current for MOSFET 4. As a result, time T-on of output MOSFET 4 is shortened.

On the other hand, when the light intensity is weak, impedance element 10 comes into a large impedance state, thus generating a voltage difference, which is sufficiently high to activate drive transistor 5, across impedance element 10. Due to this fact, the minimum current I-ft required to turn on output MOSFET 4 becomes smaller, thus improving the dynamic sensitivity of this apparatus.

In order to drive the photo-coupler apparatus in a high speed switching mode, both time T-on and time T-off, which is the period from the interruption of an input signal to the turn off of output MOSFET, should be shortened. To this end, a large signal should be applied to light emitting element 1 so as to emit a strong light. When photoelectromotive diode array 2 receives a strong light, a large amount of current is generated in this array and it charges the gate-source capacitor of MOSFET 4 quickly. As a result, time T-on is shortened.

On the other hand, time T-off can be shortened by adjusting the light responding rate of impedance element 10. In other words, if impedance element 10 is so arranged that it keeps the small resistance state for a while (a period during which the charges between the source and gate of transistor 5 can be discharged) after an input signal having been interrupted, that is, no light is emitted by light emitting element 1, drive transistor 5 rapidly comes into an ON state during this period, thus shortening time T-off.

As is evident from the above mentioned explanation, the photo-coupler apparatus of this invention is capable of improving its dynamic sensitivity and shortening the switching times of output contacts simultaneously.

In addition, in order to further raise the limiting value of charging up current for the MOSFET, a zener diode 10b may be parallel-connected with light sensitive impedance element 10 as shown in FIG. 8. In this structure, in the same manner as that of the above mentioned photo-coupler apparatus, light sensitive impedance element 10 has a large resistance when a light signal is so weak that a high sensitivity is required, thus improving its dynamic sensitivity. On the other hand, when the light signal is so strong that a sufficient amount of current flows for charging MOSFET 4, impedance element 10 comes into a small resistance state and does not limit the charging up current. Thus, time T-on is shortened. As a result, the photo-coupler apparatus having this structure can improve the dynamic sensitivity and shorten time T-on. Impedance element 10 may be fabricated to keep the small resistance state for a while after an input light has been interrupted. In this case, drive transistor 5 quickly turns on during this period. Thus, time T-off is also shortened.

Still in addition, normal diode array 10c may be connected in place of zener diode 6b as shown in FIG. 9. In this structure, the clamp voltage of array 10c can be arranged by changing the number of diodes. As a result, the photo-coupler apparatus having this structure can further improve the charging efficiency.

These and other objectives, features, and advantages of the present invention will be more apparent from the following detailed description of preferred embodiments in conjunction with the accompanying drawings.

DETAILED DESCRIPTION OF PREFERRED EMBODIMENTS

Figure 4:
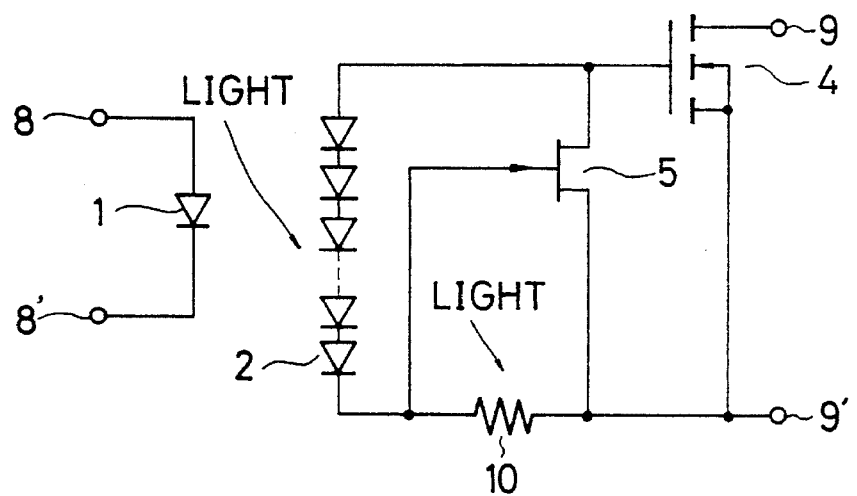
FIG. 4 shows the circuit structure of a photo-coupler apparatus according to the first embodiment of this invention.

FIG. 4 shows the circuit structure of a photo-coupler apparatus according to the first embodiment of the present invention.

The photo-coupler apparatus of this embodiment has a light emitting element 1 in the primary side. Element 1 emits a light after having been activated by an input signal introduced through input terminals 8 and 8'. The secondary side of this apparatus is comprised of the following: photoelectromotive diode array 2 which generates an electromotive force by receiving a light signal from light emitting element 1; a light sensitive impedance element 10 whose impedance value varies according to the strength of the light signal from light emitting element 1; an output MOSFET 4 whose gate and source are connected with the respective ends of the series connected circuit of photoelectromotive diode array 2 and impedance element 10; and a normally-ON drive transistor 5. The control electrode (base) of this transistor 5 is connected to the node of photoelectromotive diode array 2 and impedance element 10. Also, the conducting electrodes (source and drain) of this transistor 5 are connected with the gate and the source of MOSFET 4 respectively. The output of this apparatus is obtained through output terminals 9 and 9'.

Figure 5:
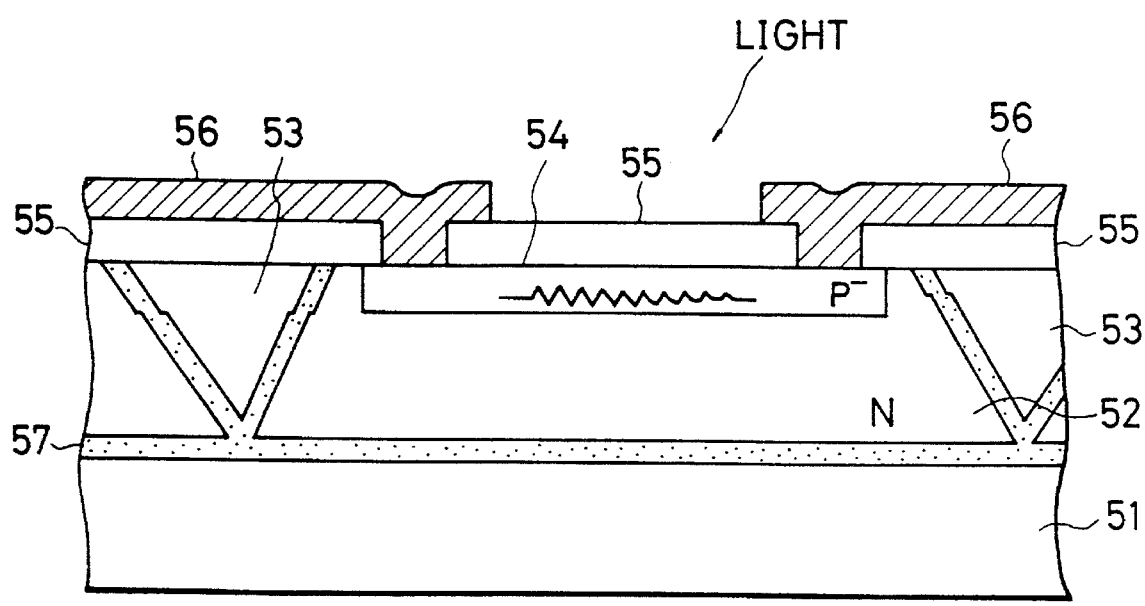
FIG. 5 is a cross sectional view of the impedance element shown in FIG. 4.

Light sensitive impedance element 10 presents a small impedance value when a strong light is given by light emitting element 1. On the contrary, it presents a large impedance value when a weak light is given by light emitting element 1. In this embodiment, an n-channel type junction FET (J-FET) is used as drive transistor 5. FIG. 5 illustrates the cross-sectional structure of light sensitive impedance element 10. This element is comprised of a diffused resistor 54 formed in an island which is electrically isolated from silicon substrate 51 by oxide film (SiO2) 57 and poll-silicon 58. Boron (B) or antimony (Sb) may be used as the impurity which is diffused into resistor 54. In this figure, 55 shows an oxide film (SiO2) and 56 shows an aluminum wiring. In such a device, an incident light is received by a part of diffused resistor 54 where it is not covered by aluminum wirings 56. The impedance of this element 10 can be changed by changing the shape of diffused resistor 54 and the size of its exposed area.

A commercially available CdS light sensor may be used as impedance element 10. However, it is appropriate that impedance element 10 is integrated into one chip together with photoelectromotive diode array 2 and FETs. In this case, the above mentioned diffused resistor may be used as impedance element 10.

When an incident light from light emitting device 1 is strong, light sensitive impedance element 10 has a small resistance. Due to this strong light, however, a large current flows through element 10, thus inducing a voltage, which is sufficiently high for the drive of transistor 5, across element 10. Transistor 5 then turns off. In this case, therefore, most of the photo-current generated by photoelectromotive diode array 2 is used in order to charge the gate-source capacitor of MOSFET 4. Because its resistance value is small, element 10, which is series-connected on the charging path, does not limit the charging current for MOSFET 4. This fact permits MOSFET 4 to rapidly turn on.

Once the incident light from light emitting element 1 is interrupted, the accumulated charges between the gate-source capacitor of transistor 5 are promptly discharged because the resistance of element 10 stays small for a while. As a result, transistor 5 rapidly turns on, allowing the gate and source of MOSFET 4 to conduct. Then, the accumulated charges between the gate and source capacitor of MOSFET 4 are promptly discharged, permitting MOSFET 4 to come into an off-state quickly.

When the incident light from light emitting element 1 is weak, element 10 has a large resistance. Due to this fact, a voltage, which is sufficiently high for the drive of transistor 5, is generated across element 10, in spite that photo-diode array 2 generates only a small amount of photo-current. Then, transistor 5 turns off so as to charge up the gate and source capacitor of MOSFET 4 with the photo-current. MOSFET 4 is, thus, set to an ON-state. Accordingly, even in the case where the current of an input signal is small, and so, light emitting element 1 emits only a weak light, MOSFET 4 can be set to an on-state. Thus, the photo-coupler apparatus presents a high sensitivity.

Figure 1:
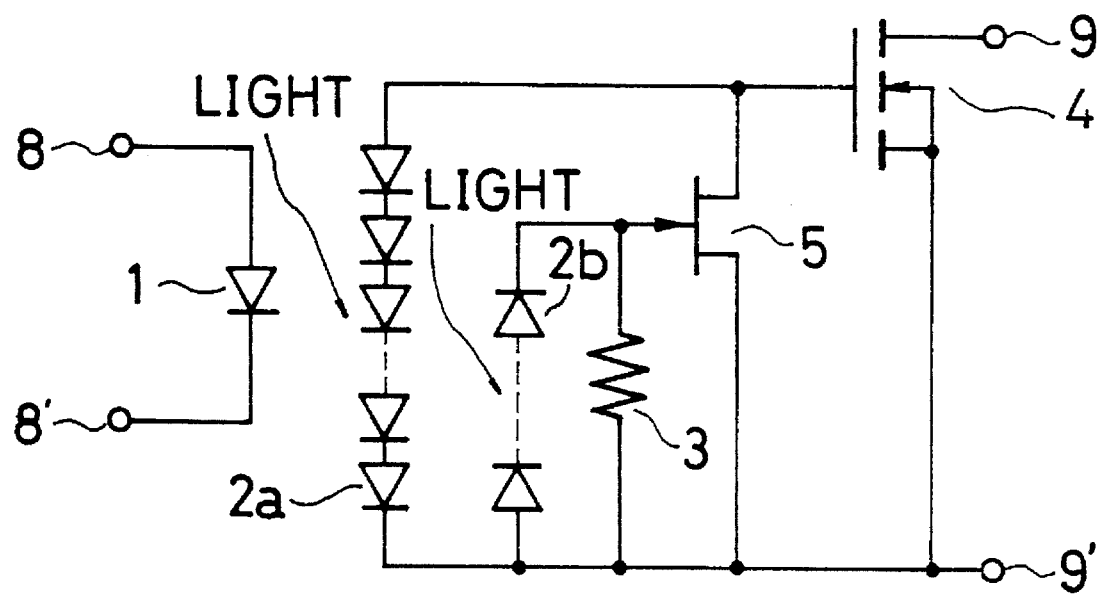
FIG. 1 shows the circuit structure of a photo-coupler apparatus according to the first prior art of this invention.
Figure 2A:
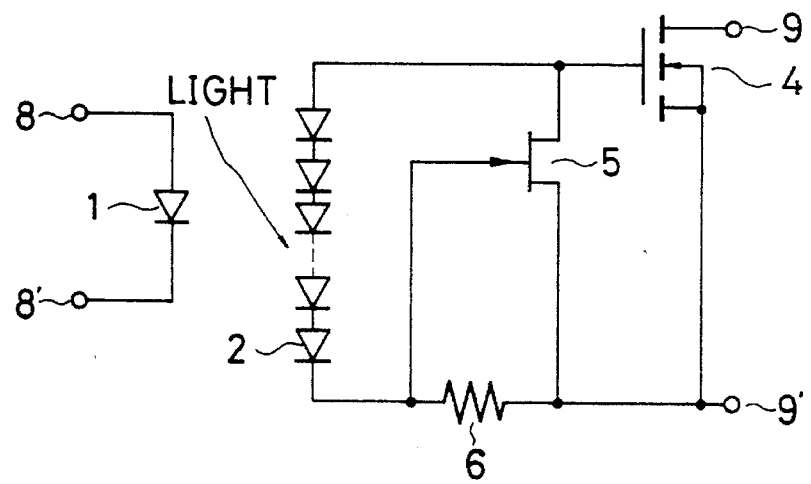
FIG. 2A shows the circuit structure of a photo-coupler apparatus according to the second prior art of this invention.
Figure 2B:
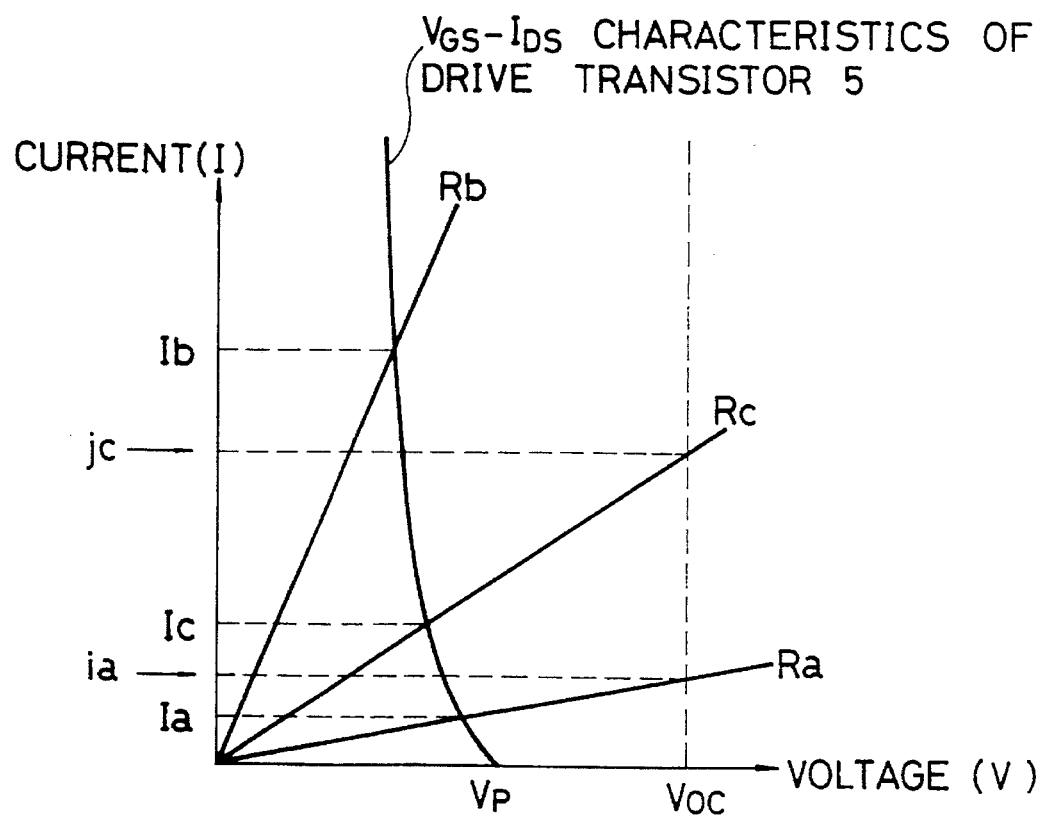
FIG. 2B shows the V-I characteristics of some elements used in the photo-coupler apparatus shown in FIG. 2A.

In order to explain the operation of this photo-coupler apparatus, the V-I characteristics of the second prior art apparatus will be described first with referring to FIG. 2B. As mentioned before, the photo-coupler apparatus of the second prior art has a simple resistor as impedance element 6. FIG. 2B shows the operational characteristics of this apparatus. Lines Ra, Rb and Rc in FIG. 2B show the V-I characteristics of element 6 when it has a large, small, or medium value of resistance. The MOSFET's operational points, at which MOSFET 4 turns on to be a steady state, are shown as the intersecting points of each V-I characteristic line and the Vgs-Ids characteristic line of transistor 5. Therefore, current Ia, Ib, or Ic of each operating point shows the minimum current required to turn on MOSFET 4 in each case. In order to improve the dynamic sensitivity of this apparatus, the minimum current should be as small as possible.

On the other hand, when the photo-current is sufficiently large, the amount of charging current for the gate-source capacitor of MOSFET 4 is limited by the resistance value of impedance element 6. Voc in FIG. 2B shows the open end voltage of photoelectromotive diode array 2. For resistance values Ra and Rc, the maximum currents which can flow through array 2 and impedance element 6 are ia and ic. As is evident from this fact, when the resistance of impedance element 6 is large, very little current flows in the circuit. As the current becomes smaller, the period required for the charging of MOSFET 4 becomes longer. Accordingly, a large current is required for shortening time T-on.

To sum up, when impedance element 6 has a large resistance (Ra), the operating current is very small, that is, Ia. This means the dynamic sensitivity of this apparatus is very high. In this case, however, T-on becomes longer due to the small current value, i.e., Ia. On the contrary, when element 6 has a small resistance value (Rb), the limiting value of current becomes sufficiently large to shorten T-on. However, the operating current becomes Ib, thus deteriorating the dynamic sensitivity. In practice, the resistance of element 6 is determined by finding a point of compromise around the mean value, i.e., Ia in FIG. 2B.

As explained above, the resistance of impedance element 6 is actually fixed in the second prior art. In said first embodiment of the present invention, the resistance of impedance element 10 varies according to the intensity change of an input light. In other words, when the intensity of light signal is weak, that means a high sensitivity is required, the resistance is sufficiently large (Ra), resulting in the high sensitivity. On the other hand, when the intensity of light signal is strong to generate a large current, the resistance of element 10 becomes smaller (Rb), thus raising the limit value of current. This makes T-on shortened. As a result, the apparatus of this embodiment can implement the high sensitivity and the shortening of T-on simultaneously without adding extra components such as zener diode 6a of the third prior art.

Figure 6A:
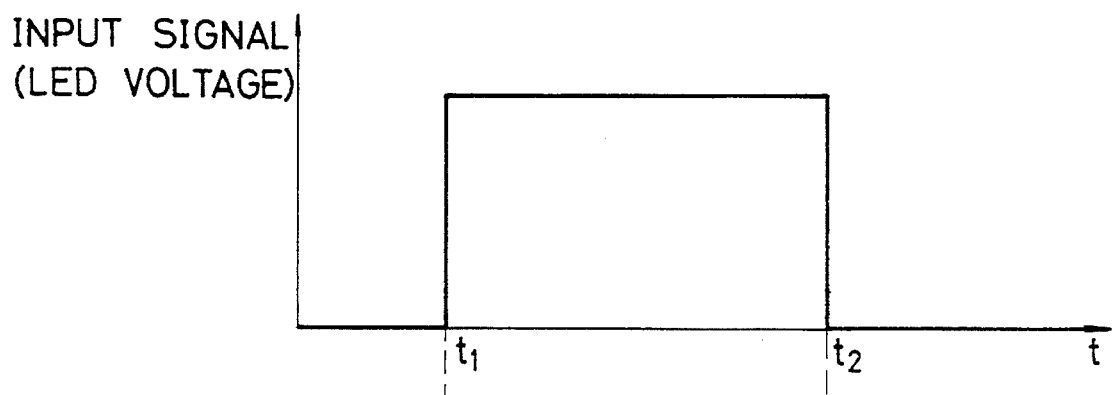
FIG. 6A is a view showing the voltage variation of an input signal for the photo-coupler apparatus shown in FIG. 4.
Figure 6B:
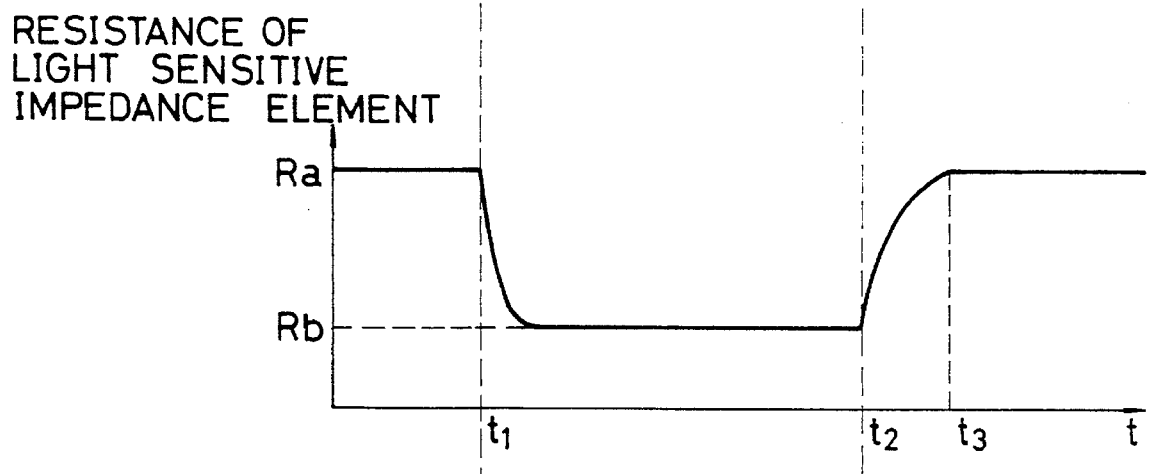
FIG. 6B is a view showing the resistance variation of the impedance element shown in FIG. 4.
Figure 6C:
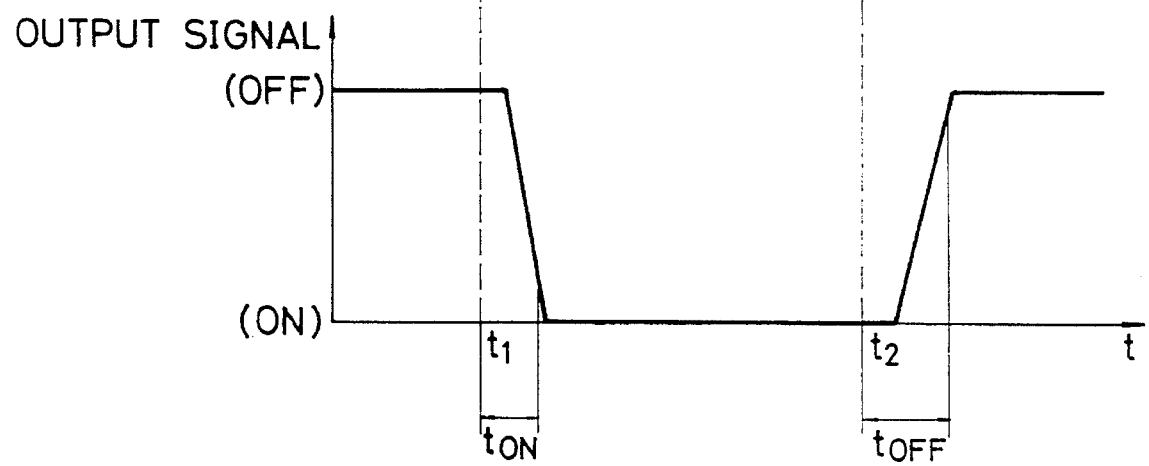
FIG. 6C is a view showing the output voltage variation from the MOSFET shown in FIG. 4.

In addition, if impedance element 10 stays in a small resistance state for a certain period (a period during which the accumulated charges between source and gate of transistor 5 are discharged) after the input signal has been interrupted, transistor 5 rapidly turns on to shorten T-off. FIGS. 6 show the relation between the input signal for light emitting element 1 and the corresponding output from the output terminals of this apparatus. Particularly, FIG. 6A shows the voltage variation of the input signal, FIG. 6B shows the resistance variation of impedance element 10 according to the input voltage variation shown in FIG. 6A, and FIG. 6C shows the output voltage variation of this apparatus according to the resistance variation shown in FIG. 6B. As is evident from these figures, the resistance of element 10 gradually increases during time t2 to t3. The accumulated charges between the gate and source of transistor 5 are promptly discharged during this time. As a result, T-off is shortened.

To control the light responding rate of impedance element 10, there are some approaches widely known. One of them is, for example, to control the life timer of photo-carriers by irradiating electron beams or proton beams and implanting ions into the resistor. Another is to change the area size of the resistor so as to change the parasitic capacitance of the resistor.

Figure 7:
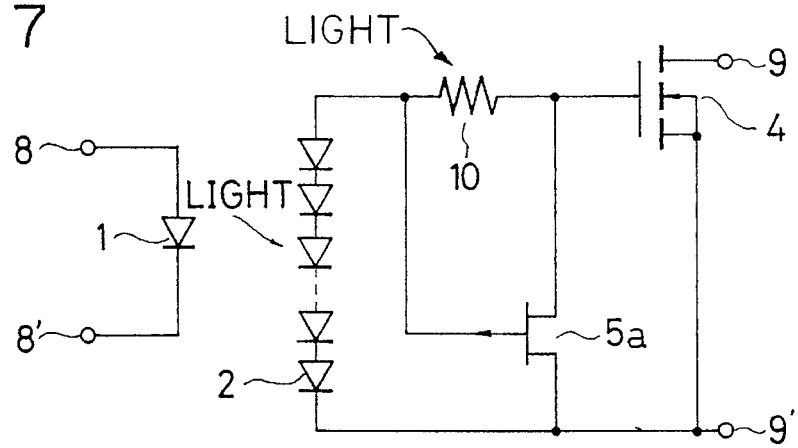
FIG. 7 shows the circuit structure of a photo-coupler apparatus according to the second embodiment of this invention.

Next, the second embodiment of this invention will be explained below with referring to FIG. 7. The photo-coupler apparatus shown in FIG. 7 uses a p-channel junction FET 5a instead of n-channel junction FET 5 used in the first embodiment of this invention. Therefore, the operation and advantages of this embodiment are almost the same as those of the first embodiment.

Figure 8:
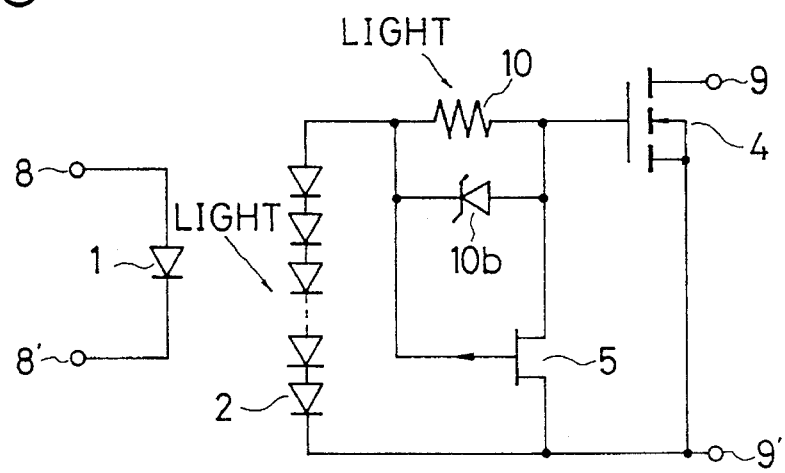
FIG. 8 shows the circuit structure of a photo-coupler apparatus according to the third embodiment of this invention.

FIG. 8 shows the structure of a photo-coupler apparatus according to the third embodiment of this invention. In addition to the structure of the first embodiment, this photo-coupler apparatus has an additional zener diode 10b which is parallel-connected with light sensitive impedance element 10. Zener diode 10b in this structure conducts when an input light is strong, thus removing the limitation of charging up current for MOSFET 4 in cooperation with light sensitive impedance element 10.

The operational characteristics of this embodiment will be explained with referring to the characteristics of the third prior art apparatus in which impedance element 6 is comprised of resistor 6a and zener diode 6b. In fact, FIG. 3B shows V-I characteristics of transistor 5, zener diode 6b and resistor 6a shown in FIG. 3A.

Figure 3A:
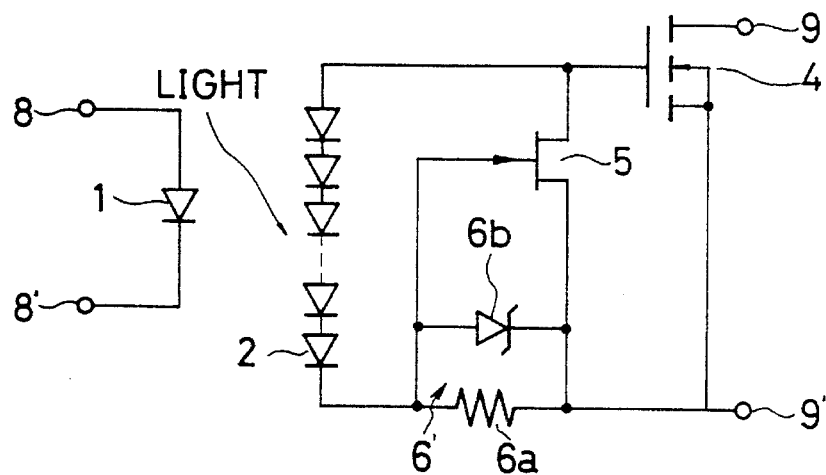
FIG. 3A shows the circuit structure of a photo-coupler apparatus according to the third prior art of this invention.
Figure 3B:
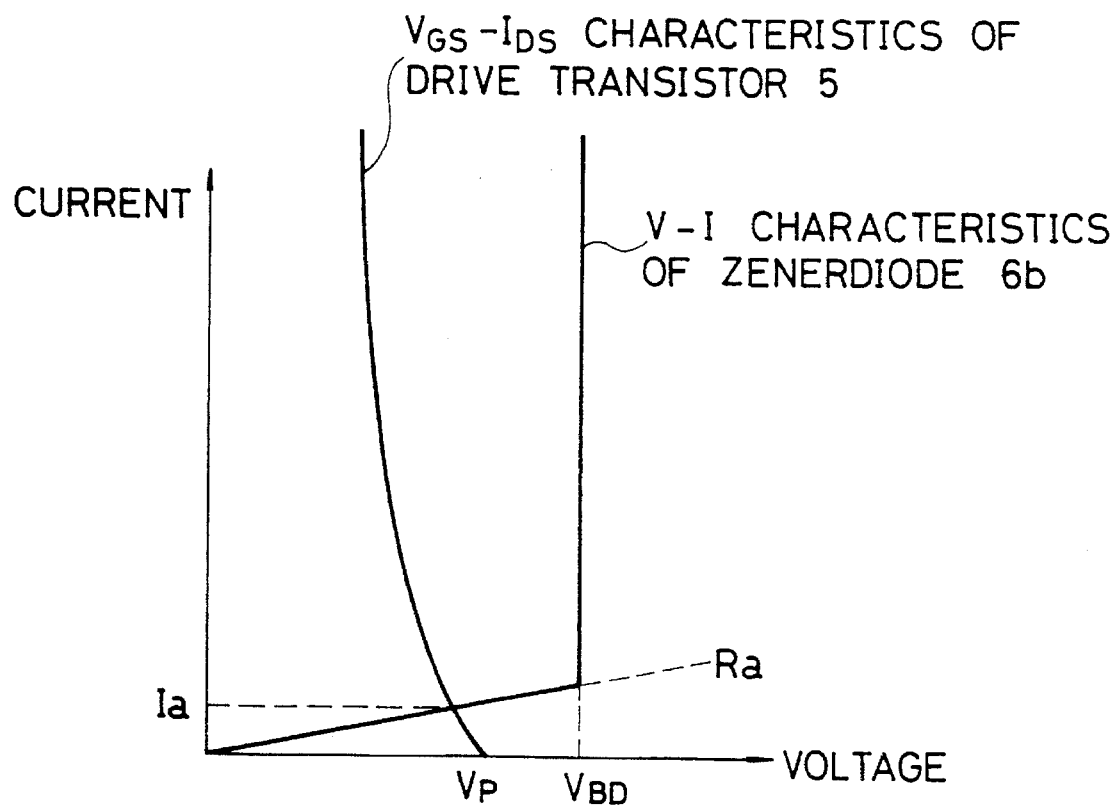
FIG. 3B shows the V-I characteristics of some elements used in the photo-coupler apparatus shown in FIG. 3A.

As is evident from FIG. 3B, when the charging up current for the gate-source capacitor of MOSFET 4 exceeds a certain value, it is bypassed through zener diode 6b. Therefore, even if resistor 6a has a large resistance value, the charging up current for MOSFET 4 is not limited. As a result, the apparatus shown in FIG. 3A can simultaneously implement the high dynamic sensitivity and the shortening of time T-on. In spite of these advantages, the apparatus shown in FIG. 3A is disadvantageous in that it requires an extra component, e.i., zener diode 6b. In addition, if resistor 6a has a large value, time T-off becomes longer. This is because resistor 6a is also used as the discharging resistor for transistor 5.

The resistance value of impedance element 6a is fixed as mentioned before in the third prior art. On the contrary, the photo-coupler apparatus of the third embodiment of this invention changes its resistance value according to the intensity change of an incident light. In the case where the incident light is so weak that a high sensitivity is required, impedance element 10 has a large resistance value (Ra), thus implementing the high sensitivity. On the other hand, when the incident light is strong so that a large amount of charging current is applied to MOSFET 4, impedance element 10 represents a small resistance value (Rb shown in FIG. 2B) to remove the current limitation, thus shortening time T-on. As a result, this apparatus can simultaneously implement the high dynamic sensitivity and the shortening of time T-on. In addition, after the incident light has been interrupted, impedance element 10 stays in a small resistance state for a certain period. This makes transistor 5 turn on rapidly, thus also shortening time T-off.

Figure 9:
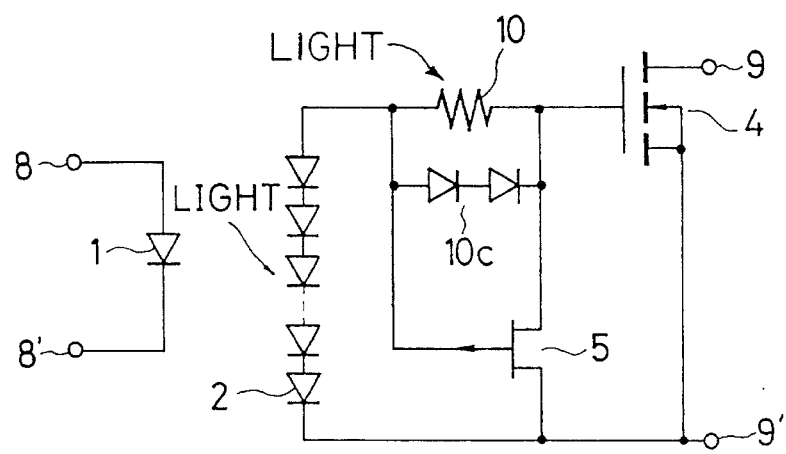
FIG. 9 shows the circuit structure of a photo-coupler apparatus according to the fourth embodiment of this invention.

FIG. 9 shows the circuit structure of a photo-coupler apparatus according to the fourth embodiment of this invention. This apparatus has normal diode array 10c instead of zener diode 10b shown in the third embodiment.

In said third embodiment, to lower the pinch-off voltage of drive transistor 5 is not difficult. But, it is very difficult to lower the zener voltage of diode 10b below a certain value. Thus, when the charging up current for MOSFET 4 is large, the voltage drop (clamp voltage) caused by zener diode 10b becomes so large that the voltage applied on the gate of MOSFET 4 becomes lower. This results in the deterioration of the charging efficiency for MOSFET 4.

The fourth embodiment overcomes the above mentioned problem by applying normal diode array 10c into the circuit. The clamp voltage of diode array 10c can be arranged by changing the number of diodes used in the array. Thus, by optimizing both the clamp voltage and Vp on Vgs-Ids characteristic of transistor 5, the charging efficiency of this apparatus can be further improved.

Figure 10:
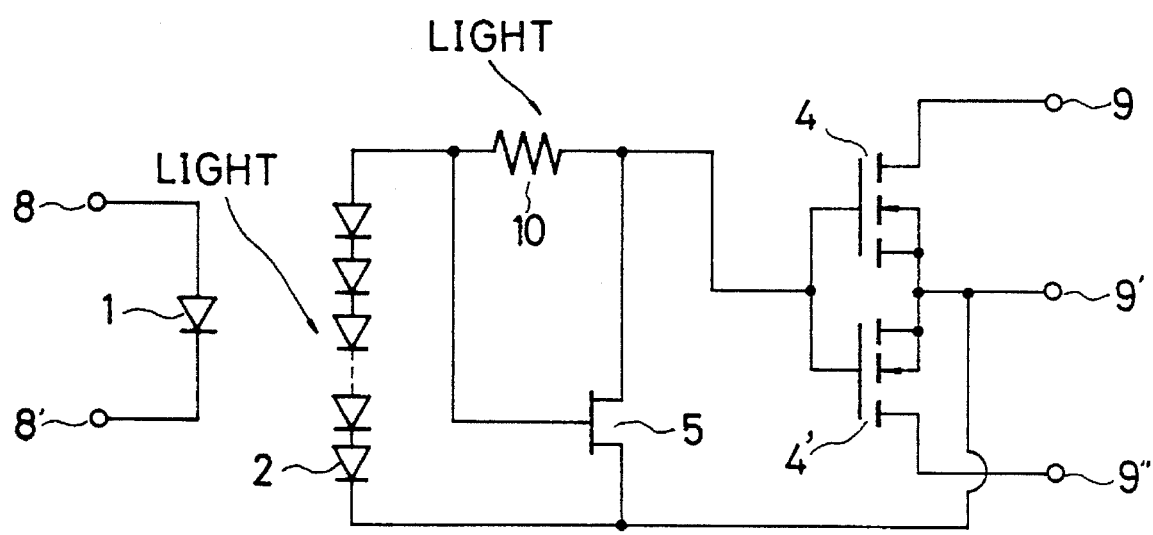
FIG. 10 shows the circuit structure of a photo-coupler apparatus according to the fifth embodiment of this invention.

FIG. 10 shows the circuit structure of a photo-coupler apparatus according to the fifth embodiment of this invention. The apparatus of this embodiment has MOSFET 4' in addition to the structure of the first embodiment. In fact, two MOSFETs 4 and 4' are antiseries-connected each other with source common. Due to this structure, the apparatus of this embodiment can control an AC signal.

As explained above, the photo-coupler apparatus of this invention has a structure to drive a normally-ON drive transistor, which is provided in order to shorten the switching times of an output MOSFET, by the voltage difference generated across a light sensitive impedance element. When the incident light from a light emitting element is strong, and so, the charging up current for the gate-source capacitor of the MOSFET is large, the light sensitive impedance element comes into a small resistance state. Accordingly, the charging up current for the MOSFET is not limited by the impedance element, thus shortening the switching-on period of the MOSFET. On the other hand, when an incident light from the light emitting element is weak, the impedance element presents a large resistance value. Then, a considerable voltage difference to turn-off the normally ON transistor arises across the light sensitive impedance element. Due to this fact, the minimum current required for turning on the output MOSFET is further reduced in this invention. The dynamic sensitivity of this apparatus is, thus, improved. In addition, the switching off time of the output MOSFET can be shortened by adjusting the light responding rate of the impedance element. As a result, a photo-coupler apparatus having an improved dynamic sensitivity and shorter switching times of output contacts can be obtained in this invention.

In addition, a zener diode may be parallel-connected with the light sensitive impedance element so as to bypass the charging up current for the output MOSFET. In this structure, zener diode conducts when an input light is strong, thus removing the current limitation for charging up the MOSFET in cooperation with the light sensitive impedance element. Further, when the intensity of an input light is weak, the impedance element presents a large resistance value, thus improving the dynamic sensitivity of this apparatus. On the other hand, when the intensity of the light signal is strong and so the charging up current is large, the impedance element presents a small resistance value. This enables to higher the limiting value of charging current. Consequently, the apparatus of this invention can implement the high dynamic sensitivity as well as the shortening of the turn-on time. Further, the impedance element stays in the small resistance state for a while after the input signal has been interrupted. During this period, the drive transistor comes into an off-state rapidly, thus also shortening the period to turn off the MOSFET. So, a photo-coupler apparatus having an improved dynamic sensitivity as well as shorter switching times of output contacts can be obtained in this invention.

Still in addition, a normal diode array can be used in place of the above mentioned zener diode. Due to this structure, the clamp voltage of the diode array can be adjusted by changing the number of diodes. Thus, a photo-coupler apparatus having an improved charging efficiency can be obtained in this invention.

What is claimed is:

1. A photo-coupler apparatus comprising:

a light emitting element for emitting light by an input signal;

a photoelectromotive diode array for generating photo-electromotive force by receiving an optical signal from said light emitting element;

a light sensitive impedance element series-connected to said photoelectromotive diode array, said light sensitive impedance element changing its impedance value according to the intensity of said optical signal from said light emitting element, wherein said light sensitive impedance element comes into a small impedance state when said optical signal from said light emitting element is strong and it comes into a large impedance state when said optical signal from said light emitting element is weak;

at least one output MOSFET whose gate and source are connected to respective ends of the series-connected circuit comprised of said photoelectromotive diode array and said light sensitive impedance element; and a normally-ON drive transistor whose control electrode is connected to the node of said photoelectromotive diode array and said light sensitive impedance element, and whose one pair of conducting electrodes are connected to the gate and the source of said output MOSFET respectively.

2. A photo-coupler apparatus comprising:

a light emitting element for emitting light by an input signal;

a photoelectromotive diode array for generating photo-electromotive force by receiving an optical signal from said light emitting element;

a light sensitive impedance element series-connected to said photoelectromotive diode array, said light sensitive impedance element changing its impedance value according to the intensity of said optical signal from said light emitting element, wherein said light sensitive impedance element comes into a small impedance state when said optical signal from said light emitting element is strong and it comes into a large impedance state when said optical signal from said light emitting element is weak;

a zener diode parallel-connected with said light sensitive impedance element;

at least one output MOSFET whose gate and source are connected to respective ends of the series-connected circuit comprised of said photoelectromotive diode array and said light sensitive impedance element; and a normally-ON drive transistor whose control electrode is connected to the node of said photoelectromotive diode array and said light sensitive impedance element, and whose one pair of conducting electrodes are connected to the gate and the source of said output MOSFET respectively.

3. A photo-coupler apparatus comprising:

a light emitting element for emitting light by an input signal;

a photoelectromotive diode array for generating photo-electromotive force by receiving an optical signal from said light emitting element;

a light sensitive impedance element series-connected to said photoelectromotive diode array, said light sensitive impedance element changing its impedance value according to the intensity of said optical signal from said light emitting element;

a normal diode array parallel-connected with said light sensitive impedance element;

at least one output MOSFET whose gate and source are connected to respective ends of the series-connected circuit comprised of said photoelectromotive diode array and said light sensitive impedance element; and a normally-ON drive transistor whose control electrode is connected to the node of said photoelectromotive diode array and said light sensitive impedance element, and whose one pair of conducting electrodes are connected to the gate and the source of said output MOSFET respectively.

4. The photo-coupler apparatus according to claim 3, wherein said light sensitive impedance element comes into a small impedance state when said optical signal from said light emitting element is strong while it comes into a large impedance state when said optical signal from said light emitting element is weak.

5. The photo-coupler apparatus according to claim 1, 2, or 3, wherein said normally-ON drive transistor is a P-channel type or a N-channel type Junction FET.

6. The photo-coupler apparatus according to claim 1, 2, or 3, wherein said light sensitive impedance element, photo-electromotive diode array, output MOSFET, and drive transistor are integrated into one chip.

7. The photo-coupler apparatus according to claim 1, 2, or 3, wherein said light sensitive impedance element stays in a small resistance state for a certain time once said optical signal from said light emitting element has been interrupted.

8. The photo-coupler apparatus according to claim 1, 2, or 3, wherein another output MOSFET is further connected to said output MOSFET in the form of anti-series connection with source common so as to control an AC signal.

\* \* \* \* \*